ELECTRONIC CIRCUIT REPAIR METHODS

Original Filed March 22, 1965 2 Sheets-Sheet 1

INVENTOR
ROBERT P. MOORE

ELECTRONIC CIRCUIT REPAIR METHODS

Original Filed March 22, 1965 2 Sheets-Sheet 2

United States Patent Office 3,523,360

Patented Aug. 11, 1970

3,523,360

ELECTRONIC CIRCUIT REPAIR METHODS

Robert P. Moore, Warminster, Pa., assignor to Sperry Rand Corporation, New York, N.Y., a corporation of Delaware Original application Mar. 22, 1965, Ser. No. 441,611, now Patent No. 3,391,451, dated July 9, 1968. Divided and this application Mar. 5, 1968, Ser. No. 710,589
Int. Cl. H01l 7/28
U.S. Cl. 29—575 5 Claims

ABSTRACT OF THE DISCLOSURE

A microelectronic circuit is provided in which integrated circuit chips are face-down bonded on a conductor carrying substrate. The chips are ultrasonically bonded to the substrate with only a sufficient amount of energy to effect a weak bond between the chips and conductors so that a damaged or defective chip can be twisted off the substrate and replaced with a good chip.

Figure 1:
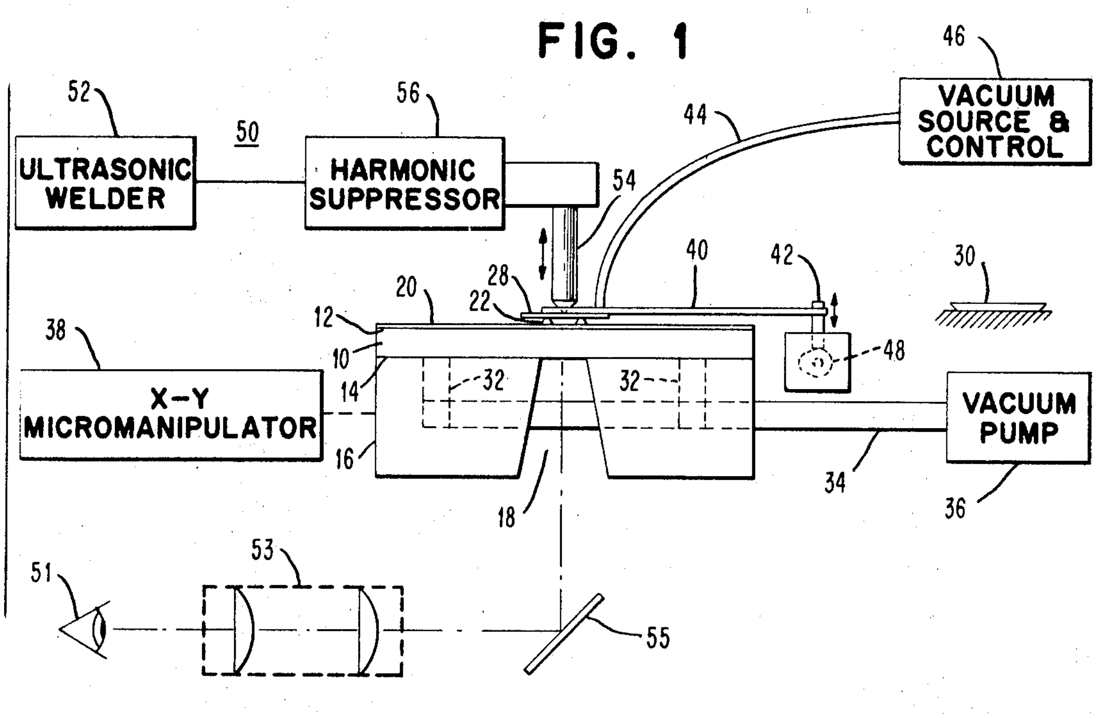

This invention is a division of my application Ser. No. 441,611 filed Mar. 22, 1965, now U.S. Pat. No. 3,391,451, issued July 9, 1968 and relates to a method of repairing microelectronic circuits wherein an integrated circuit chip is face-down bonded to a substrate.

In the past, integrated circuit chips (also termed monolithic or hybrid circuits) have been prepared wherein such a chip usually includes a plurality of active elements such as transistors, resistors, capacitors and the like, intercoupled in an integral manner on a single silicon chip. Each chip was packaged individually in a packaging container known as a can or flat-pack. Individual leads are connected to the packaged chip for connection to exterior circuitry. However, the cost of packaging containers, such as cans or flat-packs, is relatively expensive, and the cost of utilizing such packaged chips requiring lead connection is high.

Thus, it becomes an object of this invention to utilize an integrated circuit chip without the need for utilizing a special package such as a can or flat-pack.

It is still another object of this invention to provide a novel electronic circuit unit including an integrated circuit chip directly connected thereto wherein the integrated circuit chip can be replaced without destroying said circuit unit.

It is yet another object of this invention to provide for a novel method for connecting an integrated circuit chip with a substrate.

Still another object of this invention is to provide for novel apparatus for connecting an integrated circuit chip to an electronic circuit contained on a substrate.

BRIEF SUMMARY

In accordance with one embodiment of this invention, a planar glass substrate has metallic conductors evaporated thereon, the conductors including raised pedestal portions for receiving an integrated circuit chip. The integrated circuit chip contains pads or lands for contacting and mating with the conductors. The integrated circuit chip is placed on top of the pedestal portions of the evaporated wires and ultrasonically welded thereto. Thus, as a final article of manufacture, integrated circuit chips are directly connected to the evaporated wires. The integrated circuit chips are welded to the wires with limited ultrasonic energy so that, upon detection of failure of a chip, the failed chip is twisted thereupon removing the failed chip from the substrate without resultant damage to the substrate whereupon a replacement chip can be subsequently welded thereupon.

In accordance with another embodiment of this invention, novel apparatus is provided including a support for holding a circuit substrate wherein the support has an aperture therein for viewing the substrate from the bottom. The substrate is held down by suitable means such as vacuum applied by a vacuum pump. An integrated circuit chip is traversed from a tray to the upper surface of the substrate by means of a holder to which vacuum is applied by a suitable source. A welding unit, relatively free of harmonic distortion, is utilized for welding the integrated circuit chip to the metallic pedestals on the substrate. Optical alignment is provided by viewing the integrated circuit chip through the substrate through the aperture of the support.

Figure 1A:
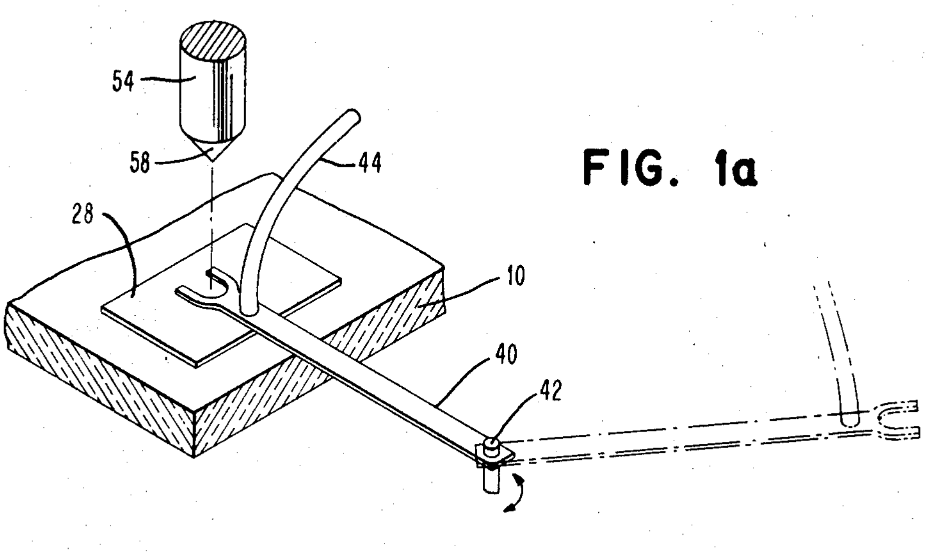
Figure 2:
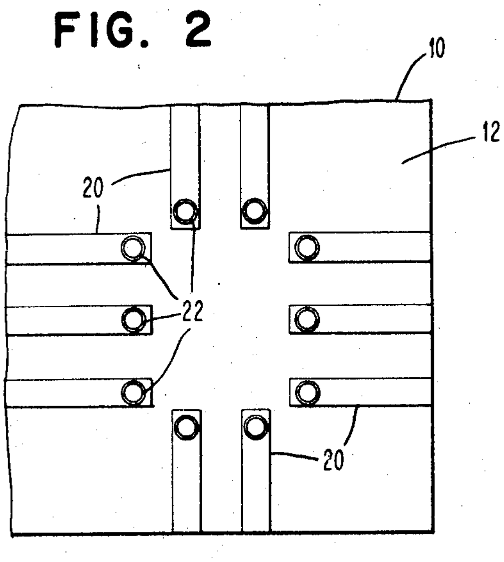
Figures 5A, 5B:
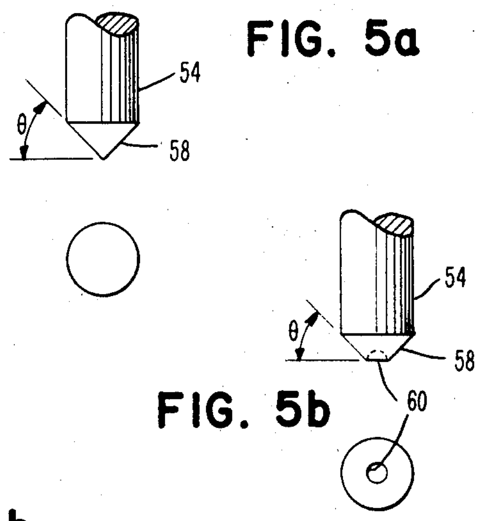
Figure 3A:
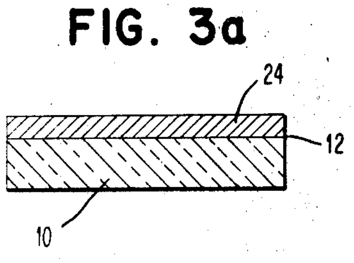
Figure 3B:
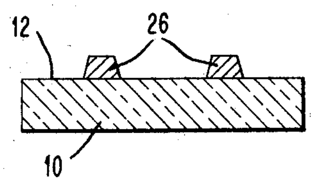
Figure 3C:
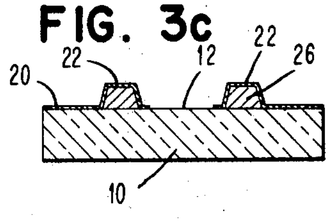
Figure 4A:
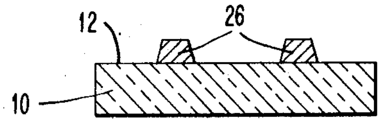
Figure 4B:
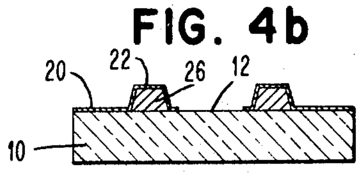
Figure 6:
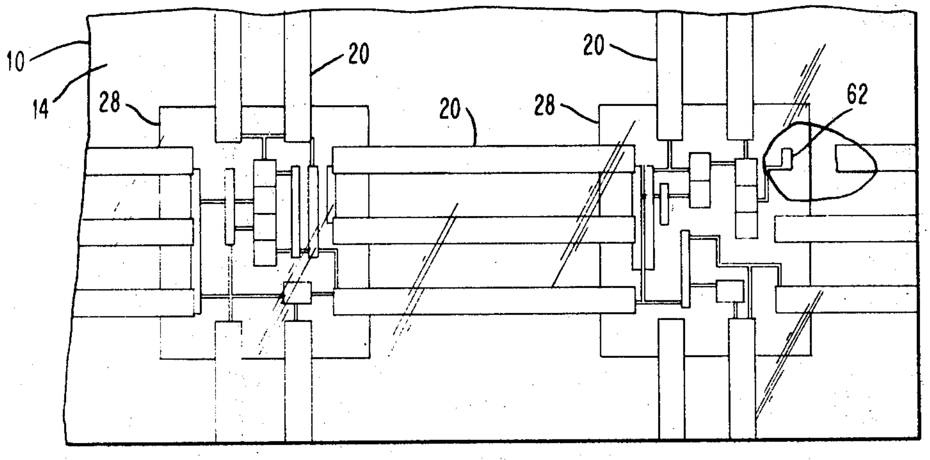

Other objects and advantages of this invention, together with its construction and mode of operation, will become more apparent from the following description when read in conjunction with the accompanying drawing in which like reference symbols refer to like components and parts and in which various elements are illustrated in an exaggerated magnified state and in which:

FIG. 1 is a diagrammatic elevated view of apparatus in connection with one embodiment of this invention;

FIG. 1*a* is a perspective view of a portion of FIG. 1, illustrating a portion of the holder and welding tip shown in FIG. 1;

FIG. 2 is a top view of a substrate including evaporated wires and pedestals;

FIGS. 3*a*, 3*b*, and 3*c* form a set of cross sectional views illustrating a method for preparing metallic conductors and pedestals upon a suitable substrate;

FIGS. 4*a* and 4*b* form a set of views illustrating another method for preparing evaporated wires and pedestals upon a suitable substrate;

FIG. 5*a* is a set of views showing one type of welding tip for use in practicing one embodiment of this invention;

FIG. 5*b* is a set of views showing another type of welding tip for use in practicing another embodiment of this invention; and FIG. 6 is a bottom view (partly in broken section) of a substrate and integrated circuit chips attached thereupon to said substrate, as viewed through the aperture of the support illustrated in FIG. 1.

Referring to FIG. 1, there is shown a transparent planar substrate 10, such as glass, having one surface 12 thereof placed in an upright position, while the other surface 14 rests upon a support 16, having an aperture 18 therein. A plurality of metallic conductors 20 including raised pedestal portions 22 at terminal portions thereof are deposited upon the surface 12 of the substrate 10. Referring to FIGS. 3*a*, 3*b*, and 3*c* there is shown various steps of one method for preparing metallic conductors together with pedestals. As illustrated in FIG. 3*a*, a film 24 of evaporated aluminum from ¼ to 1 mil in thickness is deposited on the surface 12 of the glass substrate 10. The film 24 is subsequently etched by means of known photo etching and masking techniques, well known in the art, to provide raised etched pedestals 26, as shown in FIG. 3*b*.

Following the preparation of the pedestals 26, the surface 12 of the substrate 10 is masked and aluminum conductors are evaporated through the mask onto the surface 12 of the substrate 10 covering the pedestals 26. The conductors are evaporated from 5,000 to 50,000 angstroms, preferably 20,000 angstroms, in thickness, thereby providing aluminum conductors 20 having pedestal portions 22 over the original etched pedestals 26, as illustrated in FIG. 3*c*.

Another embodiment of the invention is illustrated in FIGS. 4*a* and 4*b* which set forth a different set of steps for preparing the substrate. The substrate 10 is masked by a mask containing the desired locations of the pedestals, and metallic pedestals are initially and directly evaporated through the mask to a thickness in the range from ¼ to 1 mil in thickness, thereby providing for pedestals 26 on top of the surface 12 of the substrate 10 as shown in FIG. 4*a*. Subsequent to the deposition of the evaporated pedestals 26 as shown in FIG. 4*a*, a different mask is placed upon the surface 12 for the location of the conductors and metallic aluminum interconnecting leads are evaporated through the mask to the thickness in the range as described hereinabove, preferably 20,000 angstroms, thereby providing for an interconnected set of leads 20, including pedestal portions 22.

By way of example, and not by limitation, the dimensions of the substrate 10 are 1″ x 2″ x ¹⁄₁₆″; an integrated circuit is, generally, approximately 40 mils square.

Referring to FIGS. 1 and 1*a*, there is shown an integrated circuit chip 28. A plurality of circuit chips 28 are located on a tray 30 which acts as a storage location for said chips 28. Numerous chips are, usually, placed upon a single substrate 10. Initially, the substrate 10 is placed with its bottom surface 14 on top of the support 16 so that a chip 28 can be placed directly onto the surface 12 of the substrate 10, above the aperture 18 within the support 16. Suitable apertures within the support 16 are utilized for coupling orifices 32 via a hose 34 to a vacuum pump 36 which is controlled by suitable means (not shown). The support 16 is movable to and fro in the horizontal directions by a suitable manipulation means shown in FIG. 1 as an X–Y micromanipulator 38. A chip holder 40, traversable about a pivot 42, has suction applied through an orifice 44 therein by means of a suitable vacuum source control means 46, which may be a vacuum source common or similar to the vacuum pump 36.

The holder 40 is initially traversed about the pivot 42 to the tray 30 to vacuum pick up a chip 28, via suction applied to the orifice 44; the holder 40 is then rotated about the pivot 42, and lowered by a suitable means such as a cam 48 to lower the chip 28 on top of the desired pedestals 22 of the substrate 10.

The positioning of the integrated circuit chip 28 with regard to the pedestals 22 of the conductors 20 is best achieved by viewing with the eye 51 through a suitable lens system 53 and suitable mirror 55 through the aperture 18 of the support 16 and through the surface 14 through the substrate 10 to thereby view the pedestal portions 22 of the conductors 20 with respect to the corresponding pads or lands 62 of the integrated circuit chip 28 (FIG. 6). Upon suitable manipulation of the X–Y micromanipulator 38, suitable alignment is achieved.

Upon placing the chip 28 on top of the pedestals 22 of the conductors 20, welding then proceeds.

Ultrasonic energy at an operating frequency, for example, 60.5 kc., is applied relatively free of harmonic distortion to the integrated circuit chip 28 by a suitable means 50, which, in the embodiment shown in FIG. 1, includes an ultrasonic welder 52 which is coupled to a welding instrument 54 through a suspension system 56 which acts as a harmonic suppressor. Primarily, fundamental energy is thereby provided from the ultrasonic welder 52 through the harmonic suppressor 56 to the welding instrument 54 directly to the integrated circuit chip 28. Energy is provided by the welding instrument 54 to the center of the chip 28 so that the chip 28 is simultaneously welded to all of the pedestals 22 therein below, the energy being transmitted through the chip to each pedestal 22 and land 62 being substantially uniform.

The welding instrument 54 has two types of tips in the preferred mode as practiced by the applicant.

Referring to FIG. 5*a*, there is shown a welding instrument 54 having a tapered tip 58. The tip 58 is tapered at an angle of 45° and has a pointed tip which is rounded to a 3 mils radius. The diameter of the instrument, preferably, is 0.062″.

In another embodiment the welding tip 54, as illustrated in FIG. 5*b*, has a diameter of 0.062″ and has a tapered tip 58 of 45° with a recessed point 60 which is recessed to a 9-mil radius. Both the pointed tip and the recessed tip have proven satisfactory. Either tip produces reliable bonding and each has the advantage of self alignment and used with integrated circuit chips regardless of size or shape.

By way of example, and not by limitation, ultrasonic energy was supplied from a welder having a selected output power from 0 to 20 watts (variable through a frequency range of 59.2 to 61.8 kc.), and a variable pulse duration of from 0 to 1.5 seconds.

Reliable bonds are made with a great degree of variance in power, bonding time and bonding force applied to the tip. These variables are optimized for and dictated by the type of bond required; that is, permanent or replaceable. A permanent type bond is easily achieved with a 3-pound bonding force wherein deliberate removal of a welded chip damages the glass substrate. In other cases, a weaker but reliable bond—where, upon removal of the chip, the pedestals are still capable of being bonded—is achieved. In this latter example, a force of 1 pound is considered optimum for bonding to allow replacement of the chip.

Integrated circuit chip pad location, and a number of pads are determined by the circuit design. A 10-pad chip can be satisfactorily bonded to a substrate by practicing the teachings of this invention.

In one practical embodiment of this invention a commercial micromanipulator and a commercial ultrasonic unit were used. The manipulator was used in conjunction with the optic system for precise control of work. The ultrasonic unit in conjunction with either bonding tip as described above, with harmonic energy suppressed, supplies the energy to the tip to produce the bonding.

Only sufficient bonding force (preferably 1 pound) is used to adhere the chip to the pedestals. Excessive force (such as 3 pounds) permanently adheres the chip to the pedestal whereby removal of the chip by twisting causes damage to the substrate. By providing a small force of 1 pound during welding, the chip can be affixed to the board or support 10, whereby, when desired to remove a faulty chip, the chip can be twisted and simply removed without damage to the pedestals 22 whereupon a replacement chip can be welded upon the undamaged pedestals.

Flexibility of bonding parameters provides precise control for permanent irreplaceable type bond. No heat is required.

The method described herein eliminates wire bonding methods used in the prior art to attach integrated circuitry to associated packaging. Bonding techniques used in the past required individual pad bonding with "flying wires." Wire bonding required a minimum of two bonds to connect a single pad, in the past. In contrast, in practicing the invention described hereinabove fewer bonds are necessary, and all connections on a multiple pad chip are made simultaneously in a minimum of time.

Although the preferred embodiments have been described, other variations will become apparent to those ordinarily skilled in the art without departing from the spirit and scope of this inventtion. Thus, transparent substrates other than glass may be used, such as plastic; other metals or compounds other than aluminum can be used. Dimensions are illustrative and are not meant to limit the invention, it being understood that it is desired that the invention be limited solely by the scope of the allowed claims.

The embodiments of the invention in which an exclusive property or privilege is claimed are defined as follows:

1. In an electronic circuit comprising a substrate having a metallic circuit pattern thereon including metallic pedestals; a method of detachably mounting an integrated circuit chip on said pedestals which comprises welding said chip to said pedestals, the energy utilized to effect said weld being controlled so as to cause said chip to adhere to said pedestals but insufficient to cause damage to said pedestals when said chip is removed from said pedestals, and twisting said chip to remove the same from said pedestals.

2. The method as claimed in claim 1 wherein said energy is applied from an ultrasonic harmonic-free source with an instrument having a tapered tip, said taper having an angle lying between 35° and 55° with the cross section of said instrument.

3. The method as claimed in claim 2 wherein said angle is 45°.

4. The method as claimed in claim 3 wherein said tip is pointed.

5. The method as claimed in claim 3 wherein said tip is recessed.

References Cited

UNITED STATES PATENTS 3,256,589 6/1966 Warren ____________ 29—401 X

PAUL M. COHEN, Primary Examiner

U.S. Cl. X.R.

29—203; 228—6